(12) United States Patent
Wang et al.

(10) Patent No.: US 11,520,243 B2
(45) Date of Patent: Dec. 6, 2022

(54) LITHOGRAPHY SYSTEM AND METHOD THEREOF

(71) Applicant: TAIWAN SEMICONDUCTOR MANUFACTURING COMPANY, LTD., Hsinchu (TW)

(72) Inventors: Shao-Hua Wang, Taoyuan (TW); Chueh-Chi Kuo, Kaohsiung (TW); Kuei-Lin Ho, Hsinchu County (TW); Zong-You Yang, Hsinchu County (TW); Cheng-Wei Sun, Hsinchu (TW); Wei-Yuan Chen, Hsinchu County (TW); Cheng-Chieh Chen, Tainan (TW); Heng-Hsin Liu, New Taipei (TW); Li-Jui Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/306,631

(22) Filed: May 3, 2021

(65) Prior Publication Data
US 2022/0066331 A1 Mar. 3, 2022

Related U.S. Application Data

(60) Provisional application No. 63/072,632, filed on Aug. 31, 2020.

(51) Int. Cl.
*G03F 7/20* (2006.01)
(52) U.S. Cl.
CPC ...... *G03F 7/70716* (2013.01); *G03F 7/70808* (2013.01)

(58) Field of Classification Search
CPC ............ G03F 7/70716; G03F 7/70808; G03F 7/70991
See application file for complete search history.

(56) References Cited

U.S. PATENT DOCUMENTS

| | | | | |
|---|---|---|---|---|
| 5,623,853 A | * | 4/1997 | Novak | G03F 7/70991 74/490.09 |
| 6,222,614 B1 | * | 4/2001 | Ohtomo | G03F 7/70716 74/490.09 |

(Continued)

FOREIGN PATENT DOCUMENTS

| | | | | |
|---|---|---|---|---|
| CN | 106933056 A | * | 7/2017 | ............... G03F 7/20 |
| JP | 2003037153 A | * | 2/2003 | ............. G03F 7/709 |

(Continued)

*Primary Examiner* — Steven Whitesell Gordon
(74) *Attorney, Agent, or Firm* — Maschoff Brennan

(57) ABSTRACT

A method includes transferring a wafer over a wafer stage on a wafer table. The wafer table includes a table body, a wafer stage, a first sliding member, a second sliding member, a first cable, a first bracket and a second bracket, and a stopper. The second sliding member is movable along a first direction, in which the first sliding member is coupled to a track of the second sliding member, the first sliding member being movable along a second direction vertical to the first direction. The first bracket and the second bracket are connected by a leaf spring. The method includes moving the wafer stage toward the edge of the table body, such that the wafer stage pushes the first cable outwardly, such that the leaf spring is moved toward a first protective film on a surface of the stopper facing the leaf spring.

20 Claims, 14 Drawing Sheets

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 2002/0079464 | A1* | 6/2002 | Driessen ............ G03F 7/70991 250/492.1 |
| 2003/0137643 | A1* | 7/2003 | Jacobs ................ G03F 7/70991 355/53 |
| 2003/0173556 | A1* | 9/2003 | Watson ................. H01J 37/20 254/389 |
| 2005/0162634 | A1* | 7/2005 | Engwall ............. G03F 7/70716 355/75 |
| 2010/0096512 | A1* | 4/2010 | Krastev ............... G03F 7/70991 248/65 |
| 2010/0097589 | A1* | 4/2010 | Brinkhuis ............... G03B 27/42 355/53 |
| 2015/0176725 | A1* | 6/2015 | Wu ..................... H01L 21/3086 355/30 |
| 2017/0031249 | A1* | 2/2017 | Broers ................ G03F 7/70775 |
| 2020/0057379 | A1* | 2/2020 | Starreveld ........... G03F 7/70991 |

FOREIGN PATENT DOCUMENTS

| | | | | |
|---|---|---|---|---|
| JP | 2008166617 | A | * | 7/2008 |
| JP | 2011081367 | A | * | 4/2011 |
| TW | 202043941 | A | * | 12/2020 ......... G03F 7/70491 |

\* cited by examiner

LITHOGRAPHY SYSTEM AND METHOD THEREOF

PRIORITY CLAIM AND CROSS-REFERENCE

The present application claims priority to U.S. Provisional Application Ser. No. 63/072,632, filed Aug. 31, 2020, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4x reduction projection printing, similar to some optical scanners, except that the EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, an absorption layer however may not fully absorb the incident light and a portion of the incident light is reflected from the absorption layer. Also the thickness of the absorption layer causes the shadowing effect. All of these often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
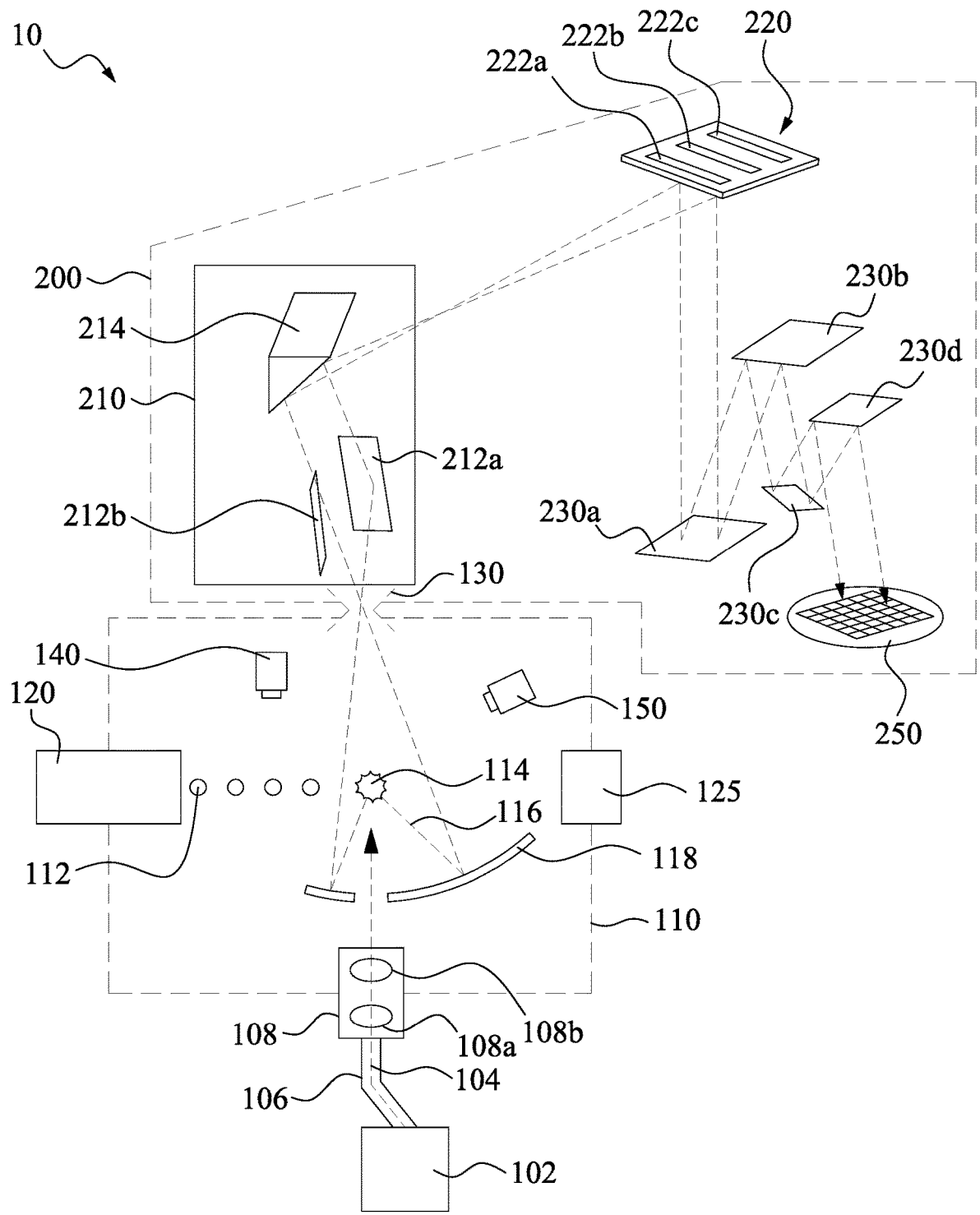
FIG. 1 is a schematic view of lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of lithography system in accordance with some embodiments of the present disclosure. The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view of lithography system in accordance with some embodiments of the present disclosure. Shown there is a EUV lithography system 10. Although the EUV lithography system 10 is illustrated as having a certain configuration of components, it will be appreciated that the disclosed lithography system 10 may include additional components (e.g., additional mirrors) or having less components (e.g., less mirrors).

The EUV lithography system 10 includes a EUV source vessel 110. A fuel droplet generator 120 is connected to the EUV source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In other embodiments, the fuel droplets 112 may include a different metal material. In some embodiments, the EUV source vessel 110 can also be referred to as a radiation source, in which radiation source employs a laser produced plasma (LPP) mechanism to generate plasma and further generate EUV light from the plasma.

The EUV lithography system 10 may also include a droplet position detection system which may include a droplet imager 140 disposed in the EUV source vessel 110 that captures an image of one or more fuel droplets 112. The droplet imager 140 may provide this captured image to a droplet position detection feedback system (not shown), which can, e.g., generate a droplet position and trajectory in response to an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The focusing system 108 includes one or more lenses 108a, 108b and/or mirrors arranged within a beam line and configured to focus the laser beam 104. The laser beam 104 is output from the focusing system 108 to the EUV source vessel 110.

The laser beam 104 transmits through a collector mirror 118 located within the EUV source vessel 110. Then, the primary laser beam 104 generated by the laser source 102 intersects the fuel droplets 112. In some embodiments, the primary laser beam 104 may be a carbon dioxide ($CO_2$) laser. In other embodiments, the primary laser beam 104 may include alternative types of lasers. When the primary laser beam 104 strikes the fuel droplets 112, the primary laser beam 104 heats the fuel droplets 112 to a predetermined temperature. At the predetermined temperature, the fuel droplets 112 shed their electrons and become a plasma 114 including a plurality of ions. In some embodiments, the ions emit EUV radiation 116 (e.g., having a wavelength of approximately 13.3 nm to about 13.7 nm).

In some embodiments, the collector mirror 118 has a concave curvature. In some embodiments, the collector mirror 118 may include a multi-layer coating having alternating layers of different materials. For example, in some embodiments, the collector mirror 118 may include alternating layers of molybdenum and silicon configured to operate as a Bragg reflector. The concave curvature of the collector mirror 118 focuses the EUV radiation 116 generated by the plasma 114 toward an intermediate focus (IF) unit 130 within an exit aperture of the EUV source vessel 110. The intermediate focus unit 130 is located between the EUV source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the EUV source vessel 110 and the scanner 200. In some embodiments, the intermediate focus unit 130 may extend into the scanner 200.

The EUV lithography system 10 may also include an EUV energy monitor 150 disposed in the EUV source vessel 110. The EUV energy monitor 150 is designed to monitor the EUV intensity or energy generated from the EUV source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the EUV source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

The EUV radiation 116 output from the EUV source vessel 110 is provided to a condenser 210 by way of the intermediate focus unit 130. In some embodiments, the condenser 210 includes first and second surfaces 212a and 212b configured to focus the EUV radiation 116, and a reflector 214 configured to reflect the EUV radiation 116 towards an EUV photomask 220. The EUV photomask 220 is configured to reflect the EUV radiation 116 to form a pattern on a surface of a semiconductor wafer 250. To produce the pattern, the EUV photomask 220 may include a plurality of absorptive features 222a, 222b, and 222c arranged on a front surface of the EUV photomask 220. The plurality of absorptive features 222a, 222b, and 222c are configured to absorb the EUV radiation 116, such that the reflected rays of EUV radiation 116 conveys a patterned defined by the EUV photomask 220.

The EUV radiation 116 is filtered through reduction optics including a series of first to fourth mirrors 230a, 230b, 230c, and 230d, which serve as lenses to reduce a size of the pattern carried by the EUV radiation 116. In some embodiments, the fourth mirror 230d conveys the EUV radiation 116 onto a on a layer of photoresist disposed on a surface of the semiconductor wafer 250. The EUV radiation 116 irradiates particular regions of the layer of photoresist based on the pattern carried by the EUV radiation 116, and thus the layer of irradiated photoresist layer can be patterned after developing it. Therefore, subsequent processing can be performed on selected regions of the semiconductor wafer 250.

Figure 2:
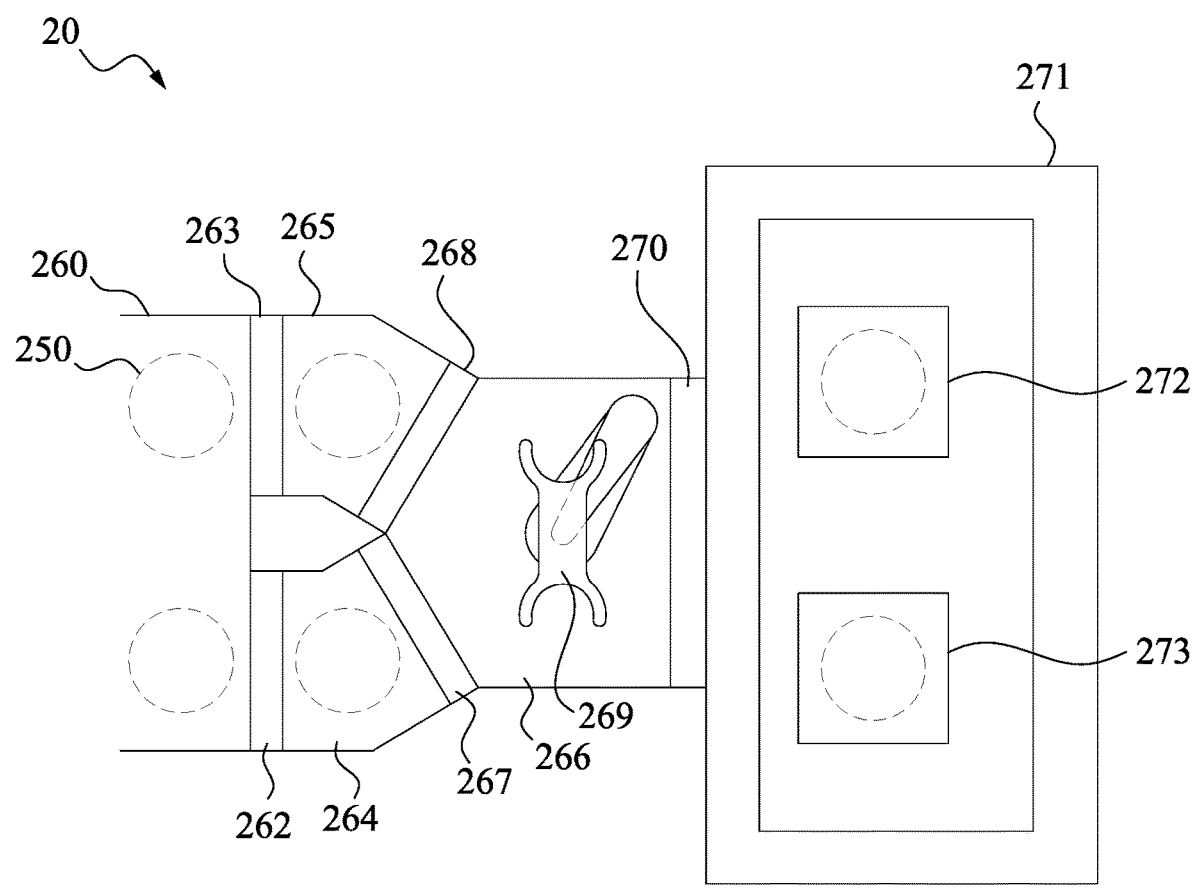
FIG. 2 is a schematic view of a lithography system in accordance with some embodiments of the present disclosure.

FIG. 2 is a schematic view of a lithography system 20 according to the present disclosure. The lithography system 20 may be applied to pattern semiconductor wafers, as discussed above with respect to the semiconductor wafer 250 of FIG. 1. Here, the wafers 250 are indicated by dashed circles. Generally, the wafers are moved from a wafer handler 260, through load locks 264, 265 and a wafer exchange chamber 266, to a lithography chamber 271. It is understood that the lithography process discussed in FIG. 1 is performed when the wafer 250 is positioned in the lithography chamber 271. In some embodiments, prior to performing the lithography process, the wafers 250 in the wafer handler 260 may have been undergone several processes, such as resist-apply, pre-bake, and other processes . . . etc. After the lithography process, wafers are returned to the wafer handler 260 for further processing steps, such as development, post bake, and the like.

The wafer handler 260 is separated from the load locks 264, 265 by gate valve assemblies 262, 263. The load locks 264, 265 are separated from the wafer exchange chamber 266 by gate valve assemblies 267, 268. Accordingly, the load locks 264, 265 can also be referred to as chambers that are separated from the wafer handler 260 and the wafer exchange chamber 266 by respective gate valve assemblies 267, 268. In some embodiments, the load locks 264, 265 may further be connected to vacuum and venting elements (not shown) that allow the load locks 264, 265 to be transitioned from atmospheric pressure to vacuum (pumped-down) and back to atmospheric pressure again (vented). In this way, the wafer exchange chamber 266 can be held at a high vacuum while wafer handler 260 is held at atmospheric pressure. The load locks 264, 265 thus serve to move wafers in and out from the wafer exchange chamber 266 while transitioning from atmospheric pressure to high vacuum.

In some embodiments, the wafer exchange chamber 266 may include a robot arm 269. The robot arm 269 is used to transfer wafers from the load locks 264, 265 to the lithography chamber 271. In some embodiments, the robot arm 269 may include a single end-effector, or dual, non-robotic, transport mechanisms could also be used without departing from the scope of the present disclosure.

The wafer exchange chamber 266 is connected to lithography chamber 271 by a gate valve assembly 270. In some embodiments, the lithography chamber 271 includes wafer stages 272, 273. The wafer stages 272, 273 are capable of movement in the directions indicated for fine alignment and exposure processes. The lithography chamber 271 thus further includes projection optics or other elements necessary to perform the lithography patterning. While lithography chamber 271 is illustrated to have two wafer stages 272, 273, less or more wafer stages may also be employed.

Figure 3:
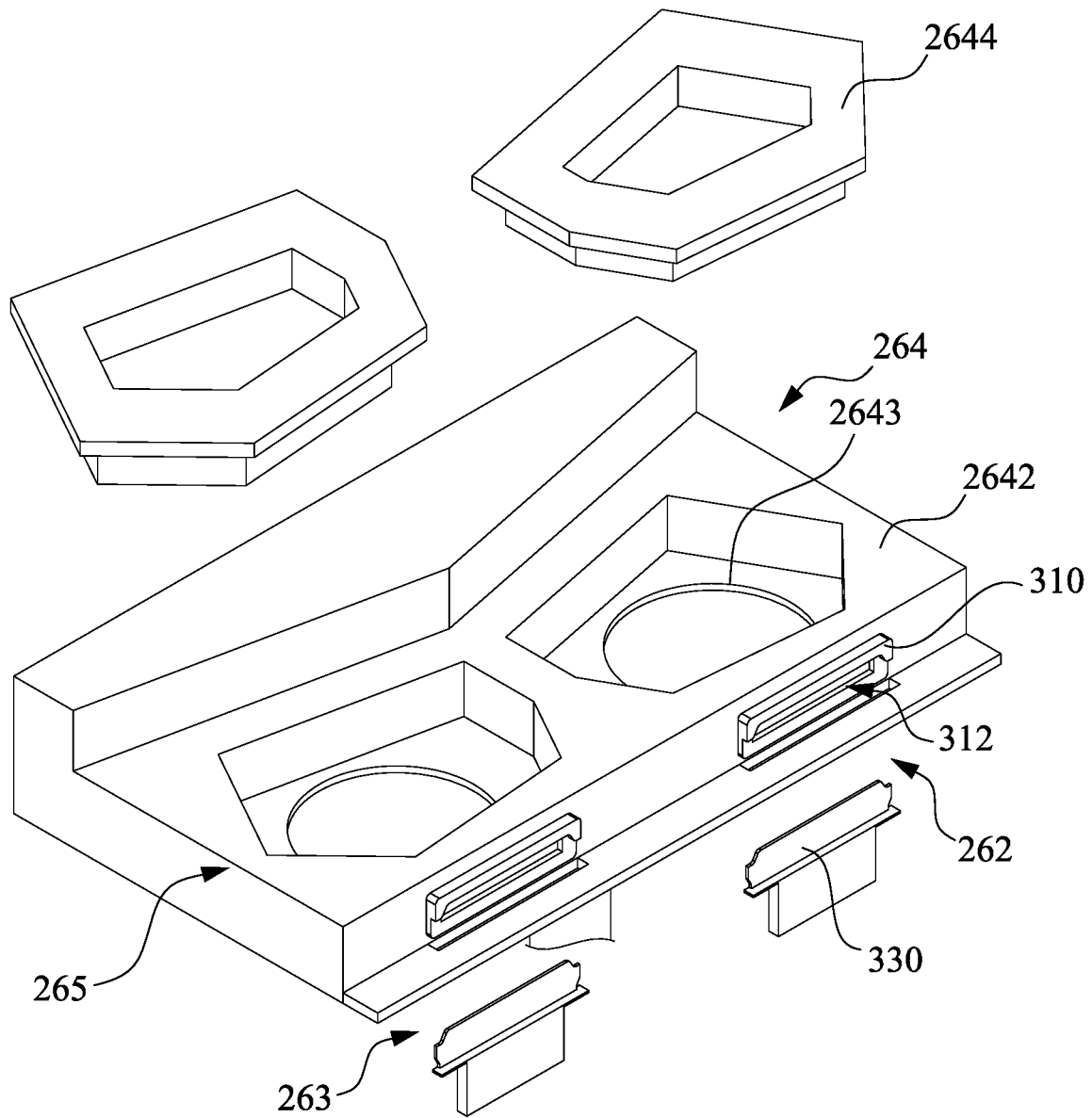
FIG. 3 is a schematic view of load locks in accordance with some embodiments of the present disclosure.

FIG. 3 is a schematic view of the load locks 264, 265 in accordance with some embodiments of the present disclosure. As shown in FIG. 3, the load lock 264 is coupled to the gate valve assembly 262, and the load lock 265 is coupled to the gate valve assembly 263, respectively. The following discussions use the load lock 264 and gate valve assembly 262 as example, while it is understood that the load lock 264 and gate valve assembly 263 may include similar or the same configuration, thus relevant details will not be repeated for simplicity.

The gate valve assembly 262 includes a gate valve seat 310 and a gate 330 facing the gate valve seat 310. In some embodiments, the gate valve seat 310 of the gate valve assembly 262 may be fixed on a surface of a body 2642 of the load lock 264. Furthermore, the gate valve seat 310 may include an opening 312, and the opening 312 may be aligned with a slot on the body 2642 of the load lock 264, such that the opening 312 is communicated with a chamber 2643 in the body 2642 of the load lock 264, which allows the wafer (e.g., the wafer 250) passes in and out from the chamber 2643 of the load lock 264 through the gate valve assembly 262.

On the other hand, the gate 330 of the gate valve assembly 262 may be movable along at least one direction. For example, the gate 330 may be movable along the vertical direction, such that when the gate 330 is moved upwardly, the gate 330 may press against the gate valve seat 310 and seal the opening 312 of the gate valve seat 310, such that the load lock 264 may be gaseously isolated from a space that is coupled to another side of the gate valve assembly 262.

In some embodiments, the load lock 264 further includes a lid 2644 over the chamber 2643 in the body 2642 of the load lock 264. The lid 2644 may cover the chamber 2643 of the load lock 264. In some embodiments, the lid 2644 may include a thermal shield (not shown).

Figure 4A:
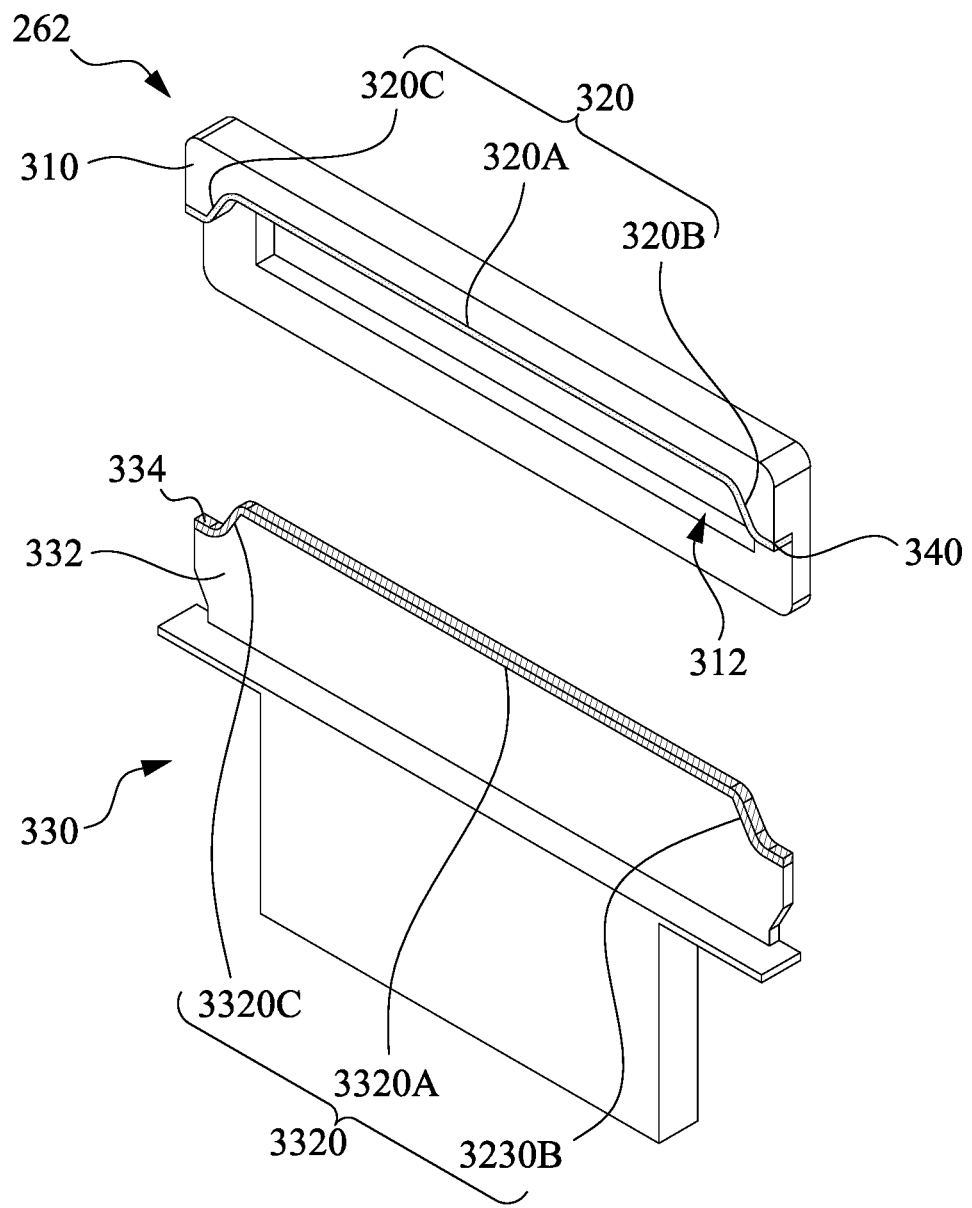
FIGS. 4A and 4B are schematic views of gate valve assemblies in accordance with some embodiments of the present disclosure.
Figure 4B:
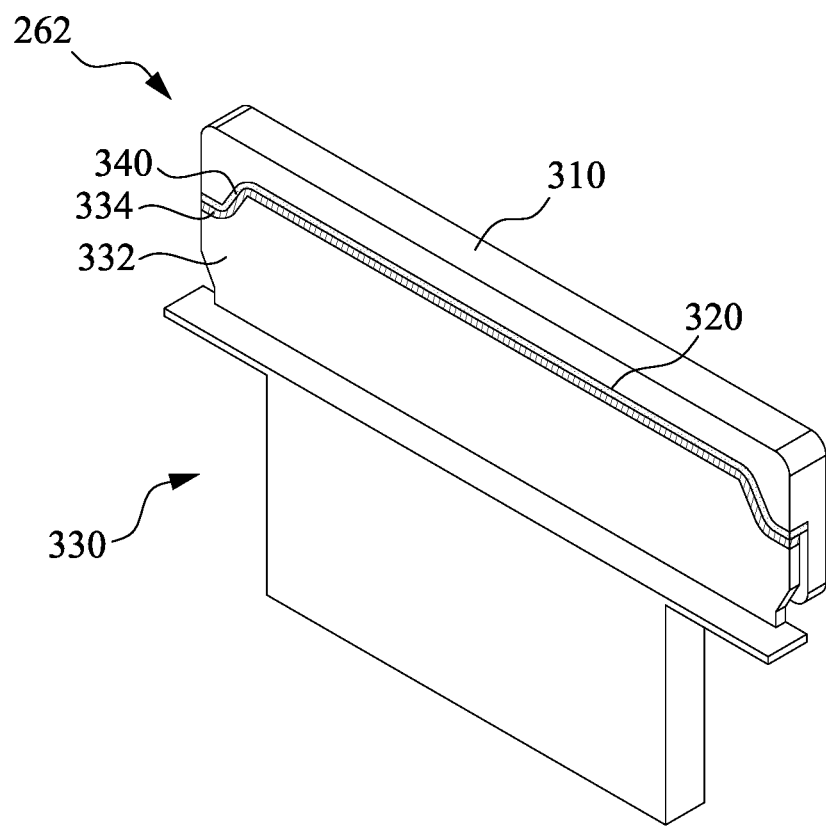

FIGS. 4A and 4B are schematic views of gate valve assembly 262 of FIG. 3 in accordance with some embodiments of the present disclosure. FIG. 4A illustrates a condition where the gate 330 is separated from the gate valve seat 310 to reveal the opening 312 of the gate valve seat 310. FIG. 4A illustrates a condition where the gate 330 presses against the gate valve seat 310 to seal the opening 312 of the gate valve seat 310.

In greater detail, the gate 330 includes a valve plate 332, and a sealing material 334 conformally disposed on the top edge 3320 of the valve plate 332. In some embodiments, the sealing material 334 may be made from a flexible or elastic material, such as rubber. In some embodiments, the top edge 3320 of the valve plate 332 has a section 3320A, and sections 3320B and 3320C on opposite sides of the section 3320A. The section 3320A of the top edge 3320 extends along the horizontal direction, and can be regarded as a horizontal surface. On the other hand, the sections 3320B and 3320C are inclined with respect to the section 3320A. As the sealing material 334 is conformally disposed on the top edge 3320 of the valve plate 332, the sealing material 334 is therefore may also include a horizontal portion and inclined portions on opposite sides of the horizontal portion.

With respect to the gate valve seat 310, the gate valve seat 310 has a surface 320 to which the sealing material 334 on the valve plate 332 of the gate 330 is pressed. In some embodiments, the surface 320 has a section 320A, and sections 320B and 320C on opposite sides of the section 320A. The section 320A of the surface 320 extends along the horizontal direction, and can be regarded as a horizontal surface. On the other hand, the sections 320B and 320C are inclined with respect to the section 320A. In some embodiments, the gate valve seat 310 is made of metal, and thus the surface 320 of the gate valve seat 310 is made of metal.

In some embodiments, a protective film 340 is conformally disposed on the surface 320 of the gate valve seat 310. In some embodiments, the protective film 340 substantially covers an entirety of the surface 320 of the gate valve seat 310. That is, the protective film 340 may cover the sections 320A, 320B, and 320C of the surface 320 of the gate valve seat 310. In some embodiments, the protective film 340 may be an adhesive film, which is detachable from the surface of the gate valve seat 310, and may be made of a material that is different from a material of surface 320 of the gate valve seat 310. In some embodiments, the protective film 340 may include a material having friction coefficient less than 0.3, and having a tensile strength (at break point) greater than 48 Mpa in vacuum. In some embodiments, the protective film 340 may be ultra high molecular weight polyethylene (UHMWPE) tape. In some other embodiments, the protective film 340 may be silicon pressure sensitive adhesive (PSA). In some embodiments, the protective film 340 may satisfy a request in a Total Organic Carbon (TOC) test of outgassing limit for refractories is zero (or negligible small) detected under temperatures about 40° C. and about 100° C., this ensure that the protective film 340 would not be decomposed under the selected temperatures, and would not contaminate other structures in the lithography chamber 400.

As shown in FIG. 4B, when the gate 330 is move upwardly, the sealing material 334 on the valve plate 332 of the gate 330 presses the protective film 340 on the surface 320 of the gate valve seat 310. The sealing material 334 may be squeezed against the protective film 340 on the surface 320 of the gate valve seat 310, so as to seal gas that passes through an opening 312 of the gate valve seat 310. In some embodiments, as the protective film 340 substantially covers an entirety of the surface 320 of the gate valve seat 310, the sealing material 334 does not directly contacts the surface 320 of the gate valve seat 310 when the gate 330 is move upwardly and seal the opening 312 (see FIG. 4B). That is, even if the gate 330 is move upwardly and seals the opening 312, the sealing material 334 is separated from the surface 320 of the gate valve seat 310 by the protective film 340, because the protective film 340 is sandwiched between the sealing material 334 and the surface 320 of the gate valve seat 310.

Figure 5:
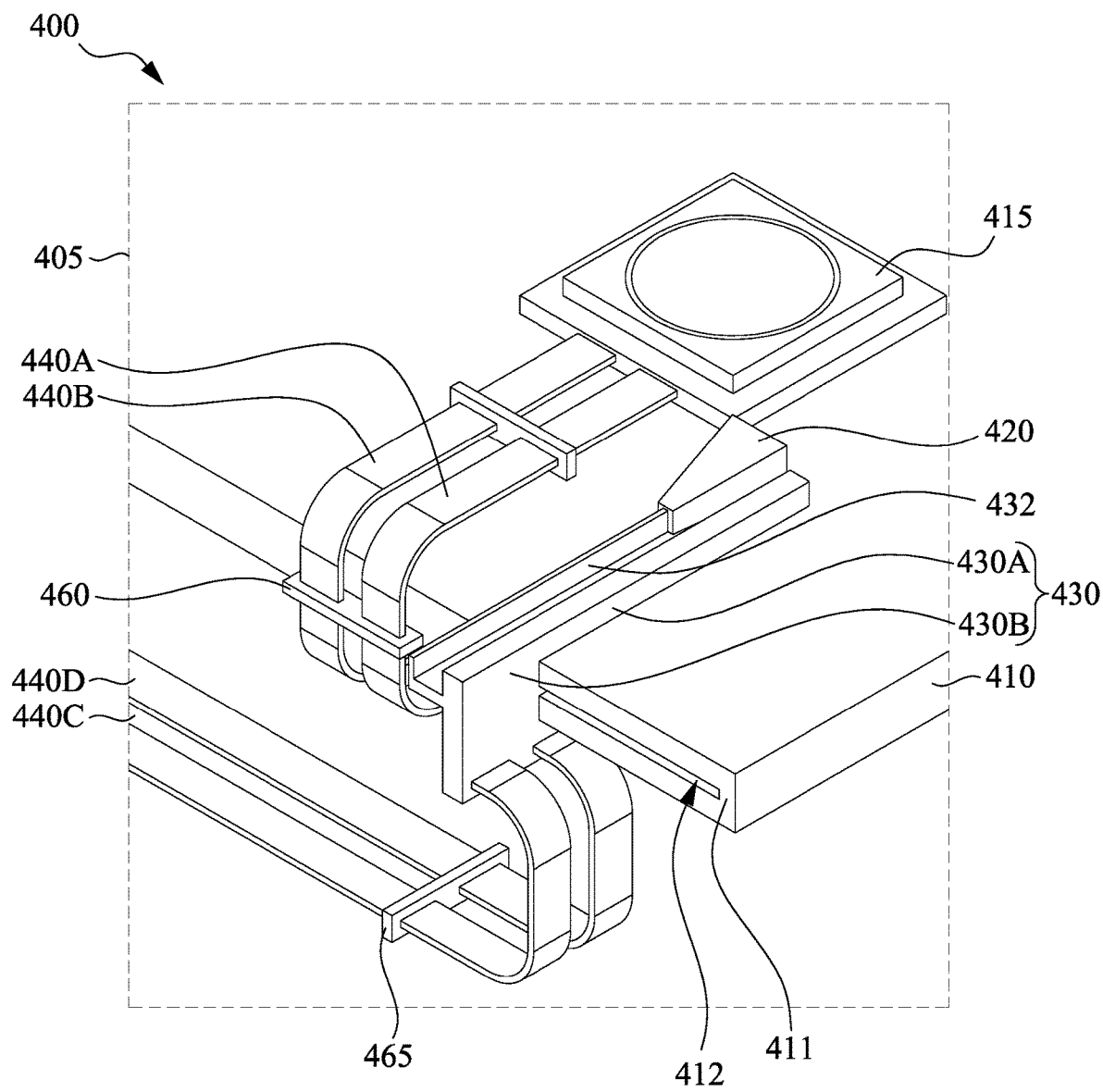
FIG. 5 is a schematic view of a wafer table of a lithography chamber in accordance with some embodiments of the present disclosure.

FIG. 5 is a schematic view of a wafer table of a lithography chamber in accordance with some embodiments of the present disclosure. It is noted that the lithography chamber 400 discussed in FIG. 5 is similar to the lithography chamber 271 discussed in FIG. 2.

The lithography chamber 400 includes a wafer table 405 having a table body 410 (e.g., stage frame). At least one wafer stage 415 is movably disposed on to the table body 410, and therefore the table body 410 may include a flat, level upper surface over which the wafer stage 415 can move. It is noted that, the wafer stage 415 here can be similar to the wafer stages 272, 273 discussed in FIG. 2. In some embodiments, the wafer stage 415 may be coupled to the table body 410 via an anti-friction device (not shown). For example, the anti-friction device may include anti-friction bearings such as air bearings, fluid bearings, roller bearings or the like.

The wafer table 405 also includes a first sliding member 420 and a second sliding member 430. In some embodiments, the second sliding member 430 has a first portion 430A extending along the upper surface of the table body 410, and a second portion 430B on a sidewall of the table body 410. In some embodiments, the second portion 430B of the second sliding member 430 is coupled to a slot 412 on the sidewall 411 of the table body 410, such that the second sliding member 430 can be movable along the sidewall 411 of the table body 410 in a first direction (e.g., the X direction).

The second sliding member 430 further includes a track 432 coupled to the first portion 430A. The track 432 extends along the upper surface of the table body 410 and extends in a second direction (e.g., the Y direction). In some embodiments, the first sliding member 420 is movably mounted on the track 432 of the second sliding member 430, such that the first sliding member 420 can be movable along the track 432 of the second sliding member 430 in the second direction (e.g., the Y direction).

The first sliding member 420 is further coupled to the wafer stage 415. As a result, the wafer stage 415 is also coupled to the second sliding member 430 through the first sliding member 420. Accordingly, with such configuration, the wafer stage 415 is movable over the upper surface of the table body 410 along a plane (e.g., X-Y plane) constructed by the first direction (e.g., the X direction) and the second direction (e.g., the Y direction). For example, the wafer stage 415 can move along the first direction (e.g., the X direction) when the second sliding member 430 is actuated to move along the slot 412 on the sidewall 411 of the table body 410, and can move along the second direction (e.g., the Y direction) when the first sliding member 420 is actuated to move along the track 432 of the second sliding member 430.

The wafer table 405 further includes a plurality of cables 440A, 440B, 440C, and 440D with utilities. For example, each of the cables 440A, 440B, 440C, and 440D may include a plurality of pipes which supply pressure dry air or vacuum air to the wafer stage 415, pipes which supply and recover a liquid for cooling the driving units (not shown) inside the wafer stage 415, and electric wires which transmit signals and feed currents from a power source (not shown) and a controller (not shown) to the wafer stage 415. In some embodiments, first sides of the cables 440A and 440B are connected to the wafer stage 415, and second sides of the cables 440A and 440B may be connected to a gas source, a liquid source, a power source, and/or a controller. Further, first sides of the cables 440C and 440D are connected to the second sliding member 430, and second sides of the cables 440C and 440D may be connected to a gas source, a liquid source, a power source, and/or a controller. In some other embodiments, the second sides of the cables 440A and 440B may be connected to the second sliding member 430, and are connected to the first sides of the cables 440C and 440D through the second sliding member 430. In some embodiments, the cables 440A and 440B are substantially parallel to each other and extend along the second direction (e.g., the Y direction), and the cables 440C and 440D are substantially parallel to each other and extend along the first direction (e.g., the X direction).

In some embodiments, at least one bracket 460 is configured to fix the cables 440A and 440B together, such that the cable 440A may be movable along with the cables 440B. Similarly, at least one bracket 465 is configured to fix the cables 440C and 440D together, such that the cable 440C may be movable along with the cables 440D. In some embodiments, the brackets 460 and 465 are also configured to fix the pipes and/or wires of each of the cables 440A, 440B, 440C and 440D, such that the pipes and/or wires of each of the cables 440A, 440B, 440C and 440D may be arranged neatly and in a desired order.

Figure 6A:
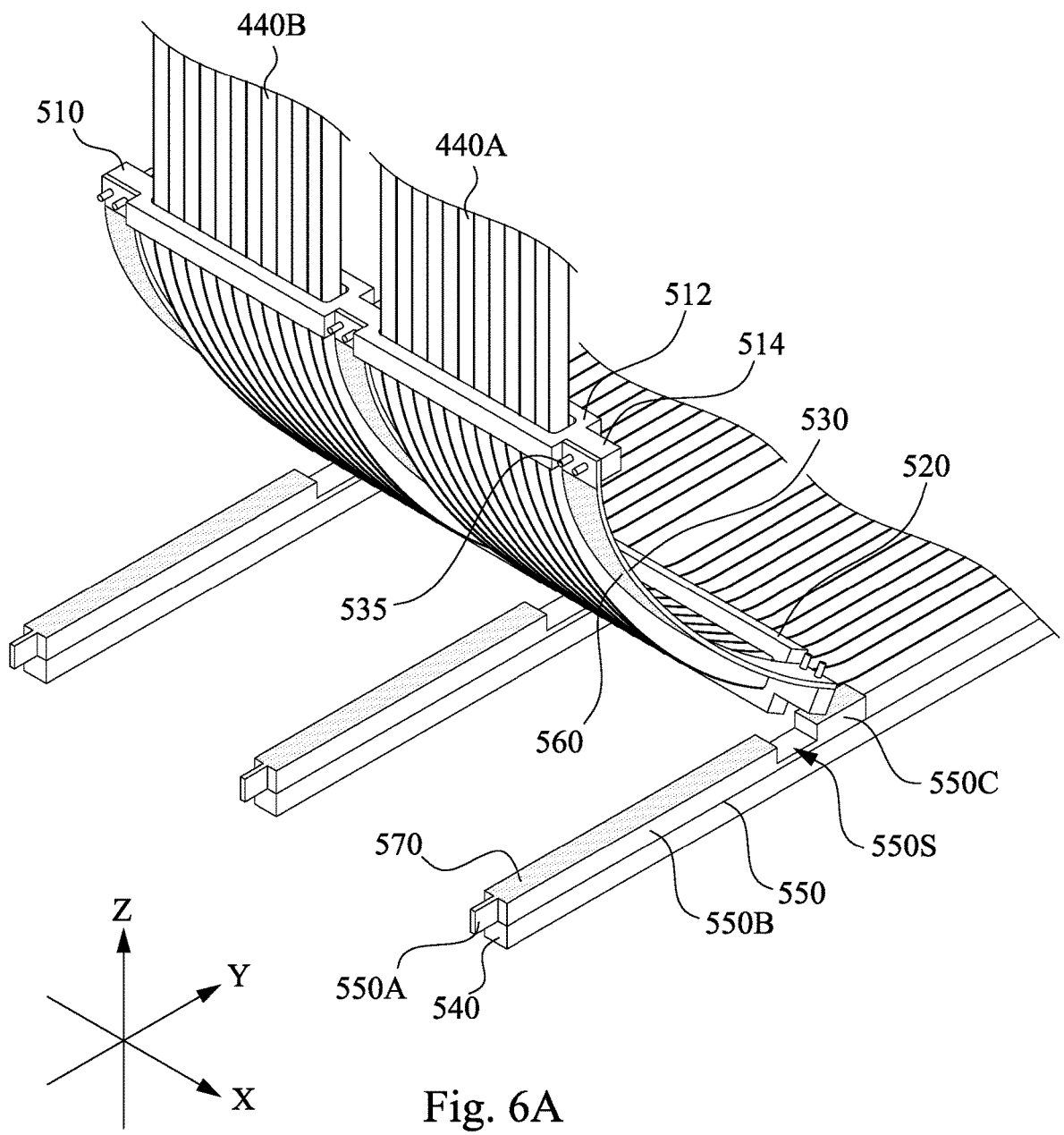
FIG. 6A is a schematic view of a wafer table of a lithography chamber in accordance with some embodiments of the present disclosure.
Figure 6B:
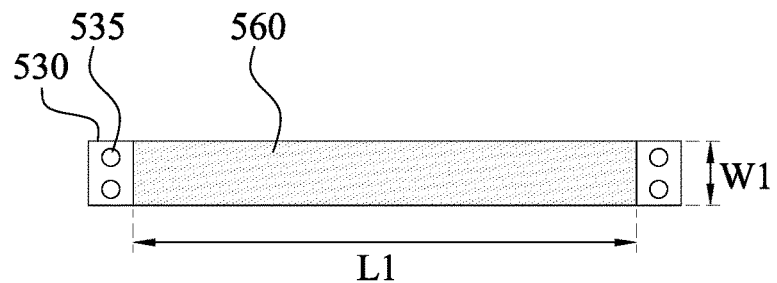
FIG. 6B is a schematic view of a leaf spring of a wafer table of a lithography chamber in accordance with some embodiments of the present disclosure.
Figure 6C:
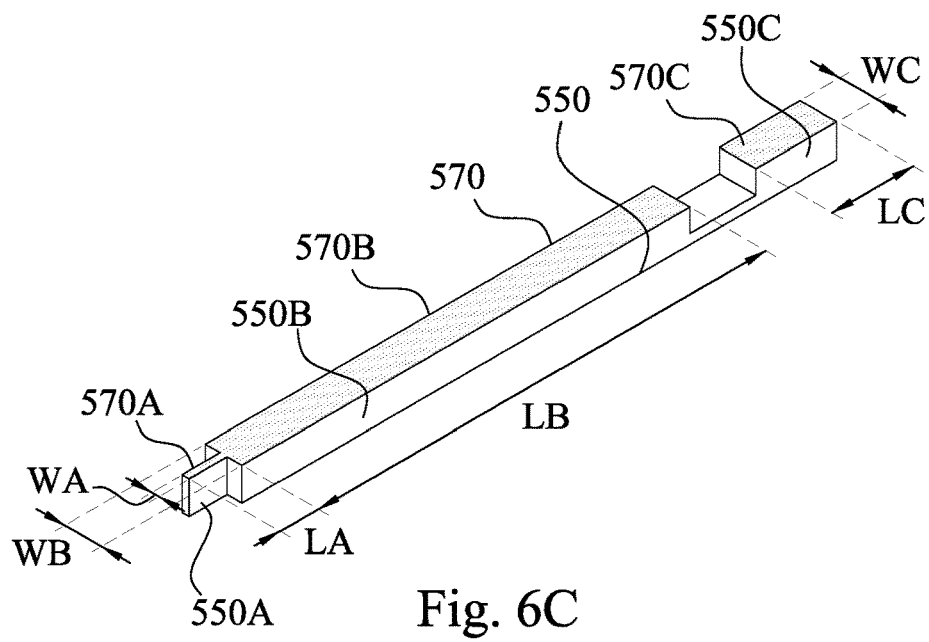
FIGS. 6C and 6D are schematic views of a stopper of a wafer table of a lithography chamber in accordance with some embodiments of the present disclosure.
Figure 6D:
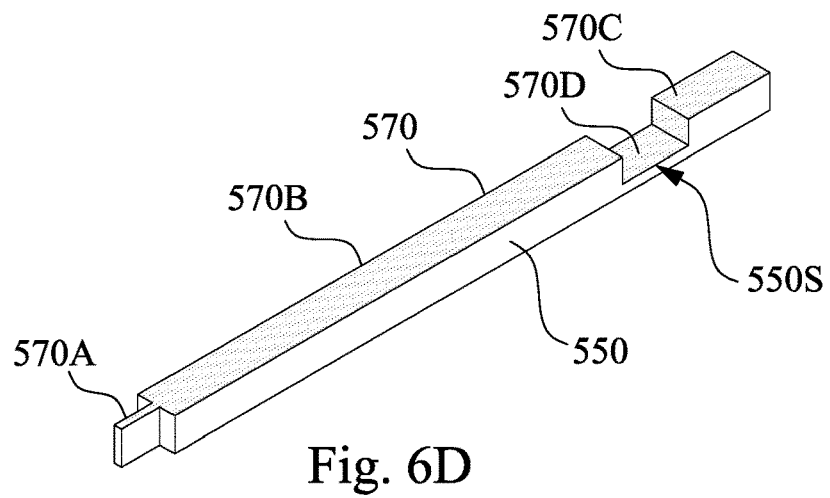

FIG. 6A is a schematic view of a wafer table of a lithography chamber in accordance with some embodiments of the present disclosure. FIG. 6B is a schematic view of a leaf spring of a wafer table of a lithography chamber in accordance with some embodiments of the present disclosure. FIGS. 6C and 6D are schematic views of a stopper of a wafer table of a lithography chamber in accordance with some embodiments of the present disclosure. It is noted that FIG. 6A is a detailed view of the cables 440A and 440B in the wafer table 405 as discussed in FIG. 5, and thus relevant details will not be repeated for simplicity.

In FIG. 6A, a first bracket 510 fixes the cables 440A and 440B together, and a second bracket 520 fixes the cables 440A and 440B together. With respect to the first bracket 510, the first bracket 510 at least includes wider portions 512 and narrower portions 514 alternately arranged along the first direction (e.g., the X direction). For example, the width of each wider portion 512 is greater than the width of each narrower portion 514 along the second direction (e.g., the Y direction). In some embodiments, each of the wider portions 512 includes a through hole for accommodating the cables 440A and 440B. In some embodiments, the narrower portions 514 are configured on opposite sides of each wider portion 512. At least one of the narrower portions 514 is between two wider portions 512, and thus this narrower portion 514 can also be referred to as connecting portion between the two wider portions 512. In some embodiments, the first bracket 510 and the second bracket 520 have substantially the same configuration, and thus relevant details will not be repeated for simplicity.

A plurality of leaf springs 530 are fixed on the first bracket 510 and the second bracket 520. In some embodiments, the leaf springs 530 are fixed on the first bracket 510 and the second bracket 520 by screws 535. Each leaf spring 530 is connected to a narrower portion of the first bracket 510 and a corresponding narrower portion of the second bracket 520. In some embodiments, each leaf spring 530 is a thin metal sheet, and has sufficient flexibility. In some embodiments, the leaf springs 530 and the first and second brackets 510, 520 may be made of the same or similar metal such as steel, stainless steel, or the like.

Frames 540 are disposed below the cables 440A and 440B and extending along the second direction (e.g., the Y direction). Referring to FIGS. 5 and 6A, the frames 540 may horizontally extend to a position below the table body 410 of the wafer table 405 and may be fixed to the table body 410. In some embodiments, the frames 540 may be made of metal, such as steel, stainless steel, or the like. In some embodiments, the frames 540, the leaf springs 530, and the first and second brackets 510, 520 may be made of the same or similar material.

Stoppers 550 are disposed on the frames 540. In some embodiments, each stopper 550 is fixed on a respective frame 540. Each stopper 550 horizontally extends along the second direction (e.g., the Y direction). As discussed above with respect to FIG. 5, the wafer stage 415 is movable along the upper surface of the table body 410, when the wafer stage 415 is moved in a direction toward an edge of the table body 410 (e.g., in the −Y direction of FIG. 5 toward the sidewall 411 of the table body 410), the wafer stage 415 may push the cables 440A and 440B in such direction, which will lead the first bracket 510 as well as the leaf springs 530 moving downwardly toward the frames 540. The stoppers 550 over the frames 540 are configured to "stop" the leaf springs 530 to limit the motion of the first bracket 510 and the leaf spring 530. In some embodiments, the stoppers 550 and the leaf springs 530 are made of different material. For example, the leaf springs 530 made to made of metal, while the stoppers 550 may be made of polymer, such as polyetheretherketone (PEEK).

In some embodiments, each of the stoppers 550 includes a first portion 550A, a second portion 550B, and a third portion 550C. In some embodiments, the first portion 550A is connected to the second portion 550B, and a slot 550S is between the second portion 550B and the third portion 550C. In some embodiments, the first portion 550A is narrower than the second portion 550B and the third portion 550C along the first direction (e.g., the X direction). This is beneficial because the narrower first portion 550A would insert into the space between two screws 535 when the first bracket 510 is moved downwardly toward the stopper 550.

Protective films 560 are disposed on the leaf springs 530, and protective films 570 are disposed on the stoppers 550. In some embodiments, each protective film 560 is disposed on a surface of the leaf spring 530 confronting a corresponding stopper 550. Similarly, each protective film 570 is disposed on a surface of the stopper 550 confronting a corresponding leaf spring 530.

In FIG. 6B, the protective film 560 covers a portion of the surface of the leaf springs 530, while leaving portions on opposite sides of the leaf spring 530 exposed. In greater details, the portions of the leaf spring 530 that are fixed by the screws 535 are not covered by the protective film 560.

The protective film 560 has a length L1 and a width W1. In some embodiments, the length L1 is in a range from about 125 mm to about 130 mm, such as 128 mm. In some embodiments, the width W1 is in a range from about 17 mm to about 21 mm, such as 19 mm. If the length L1 and the width W1 are too small, the protective film 560 may not have sufficient area to cover the leaf spring 530. If the length L1 and the width W1 are too large, this may cause material waste and does not significantly improve the performance.

In FIG. 6C, the protective film 570 includes a first portion 570A, a second portion 570B, and a third portion 570C, in which the first portion 570A, the second portion 570B, and the third portion 570C are disposed on the first portion 550A, the second portion 550B, and a third portion 550C of the stopper, respectively. That is, the slot 550S of the stopper 550 is free from coverage of the protective film 570.

The first portion 570A has a length LA and a width WA. In some embodiments, the length LA is in a range from about 8 mm to about 12 mm, such as 10 mm. In some embodiments, the width WA is in a range from about 3 mm to about 4 mm, such as 3.5 mm. The second portion 570B has a length LB and a width WB. In some embodiments, the length LB is in a range from about 118 mm to about 122 mm, such as 120 mm. In some embodiments, the width WB is in a range from about 14.5 mm to about 18.5 mm, such as 16.5 mm. The third portion 570C has a length LC and a width WC. In some embodiments, the length LC is in a range from about 58 mm to about 62 mm, such as 60 mm. In some embodiments, the width WC is in a range from about 14.5 mm to about 18.5 mm, such as 16.5 mm. If the lengths LA, LB, LC and the widths WA, WB, WC are too small, the protective film 570 may not have sufficient area to cover the stopper 550. If the lengths LA, LB, LC and the widths WA, WB, WC are too large, the protective film 570 are too large, this may cause material waste and does not significantly improve the performance. In some embodiments, the first portion 570A is narrower than the second portion 570B and the third portion 570C, and the second portion 570B have substantially the same width as the third portion 570C.

In FIG. 6D, the protective film 570 may further includes a fourth portion 570D that covers the slot 550S of the stopper 550. That is, an entirety of the top surface of the stopper 550 is covered by the protective film.

In some embodiments, the protective films 560 and 570 may be adhesive films, which is detachable from the surfaces of the leaf springs 530 and the stoppers 550, respectively, and may be made of a material that is different from the materials of the leaf springs 530 and the stoppers 550. In some embodiments, the protective films 560 and 570 may include a material having friction coefficient less than 0.3, and having a tensile strength (at break point) greater than 48 Mpa in vacuum. In some embodiments, the protective films 560 and 570 may be ultra high molecular weight polyethylene (UHMWPE) tape. In some other embodiments, the protective films 560 and 570 may be silicon pressure sensitive adhesive (PSA). In some embodiments, the protective films 560 and 570 may satisfy a request in a Total Organic Carbon (TOC) test of outgassing limit for refractories is zero (or negligible small) detected under temperatures about 40° C. and about 100° C., this ensure that the protective films 560 and 570 would not be decomposed under the selected temperatures, and would not contaminate other structures in the lithography chamber 400.

Figure 7A:
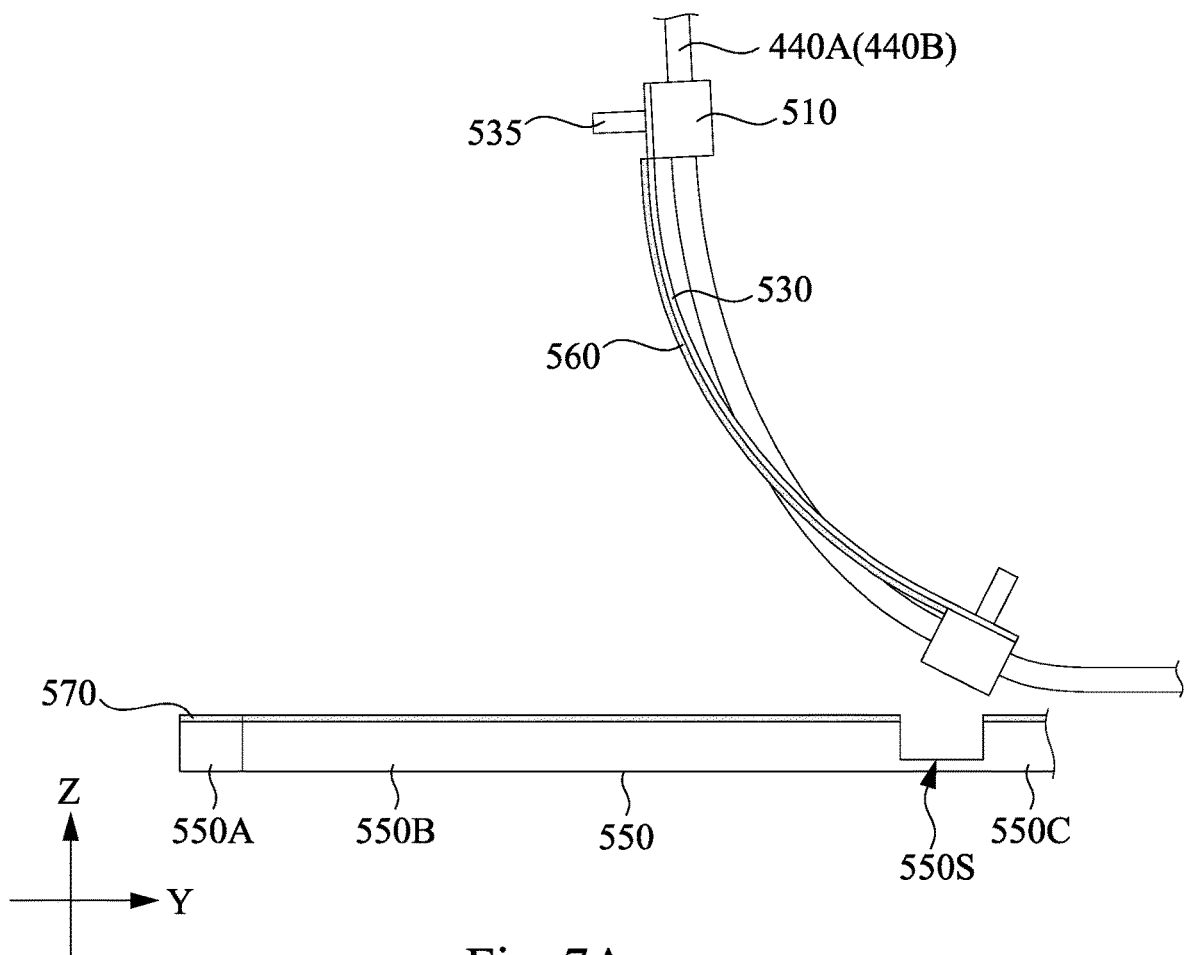
FIGS. 7A and 7B are side views of a wafer table of a lithography chamber in accordance with some embodiments of the present disclosure.
Figure 7B:
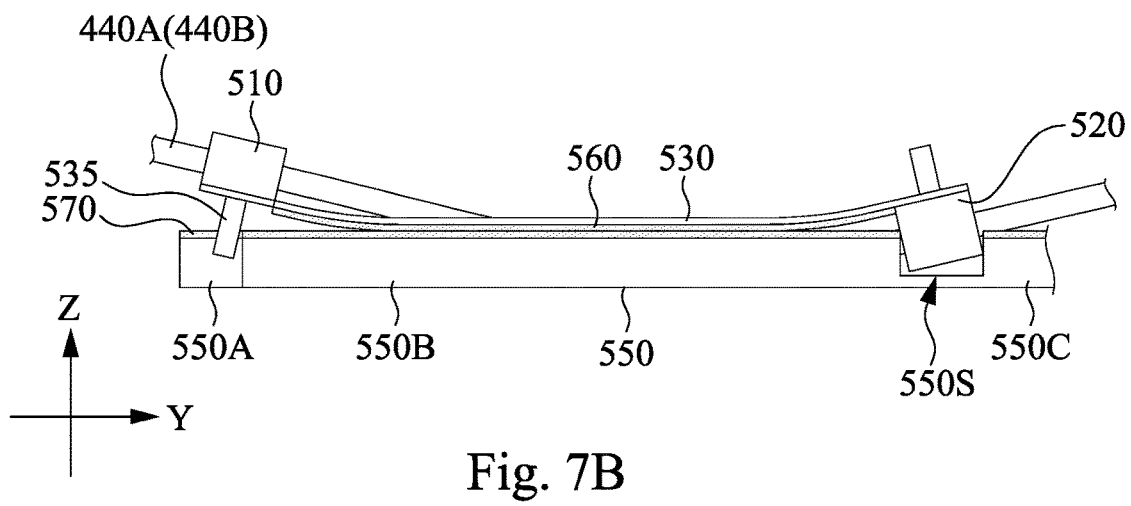

FIGS. 7A and 7B are side views of a wafer table of a lithography chamber in accordance with some embodiments of the present disclosure. In greater details, FIGS. 7A and 7B illustrate the structural relationships between the leaf spring 530 and the stopper 550 under different conditions.

Referring to FIGS. 5 and 7A, FIG. 7A illustrates a first condition where the wafer stage 415 is in a first position away from an edge (e.g., the edge where the sidewall 411 locates) of the table body 410. For example, to reach the first position, the wafer stage 415 may be moved toward the +Y direction by moving the first sliding member 420 toward the +Y direction along the track 432 of the second sliding member 430. Accordingly, the cable 440A (or cable 440B) is pulled inwardly, such that the first bracket 510 and the second bracket 520 may be raised together with the cable 440A. As a result, the first bracket 510 and the second bracket 520 are spaced from the stopper 550, and the leaf spring 530 is not in contact with the stopper 550. In greater detail, the protective film 560 on the leaf spring 530 is separated from the protective film 570 on the stopper 550 under the first condition.

Referring to FIGS. 5 and 7B, FIG. 7B illustrates a second condition where the wafer stage 415 is in a second position close to the edge (e.g., the edge where the sidewall 411 locates) of the table body 410. For example, to reach the second position, the wafer stage 415 may be moved, from the first position discussed in FIG. 7A, toward the −Y direction by moving the first sliding member 420 toward the −Y direction along the track 432 of the second sliding member 430. Accordingly, the cable 440A (or cable 440B) is pushed outwardly, such that the first bracket 510 and the second bracket 520 may be lowered together with the cable 440A. As a result, the first bracket 510 and the second bracket 520 are close the stopper 550, and the leaf spring 530 is in contact with the stopper 550. In greater detail, the protective film 560 on the leaf spring 530 is in contact with the protective film 570 on the stopper 550 under the second condition. In some embodiments, the second bracket 520 may be inserted to the slot 550S of the stopper 550. As mentioned above, because the first portion 550A of the stopper 550 has a narrower width, the screws 535 on the first bracket 510 may bypass the first portion 550A of the stopper 550 and would not directly hit the first portion 550A of the stopper 550.

In some embodiments, because the protective films 560 and 570 are disposed on the leaf spring 530 and the stopper 550, the leaf spring 530 would not be in direct contact with the stopper 550 under the second condition of FIG. 7B. With this configuration, particles generated in the chamber may be reduced by preventing direct rub or collision between leaf spring 530 and stopper 550. Accordingly, the wafer stage cleaning period can be extended. Further, because the particles are reduced, the wafer fall on particle count (which is determined by a wafer fall on particle monitor) may be reduced.

In some embodiments, one of the protective films 560 and 570 may be omitted. For example, if the protective film 560 is omitted and the protective film 570 is present, the leaf spring 530 would be in direct contact with the protective film 570 under the second condition of FIG. 7B. On the other hand, if the protective film 570 is omitted and the protective film 560 is present, the stopper 550 would be in direct contact with the protective film 560 under the second condition of FIG. 7B.

Figure 8:
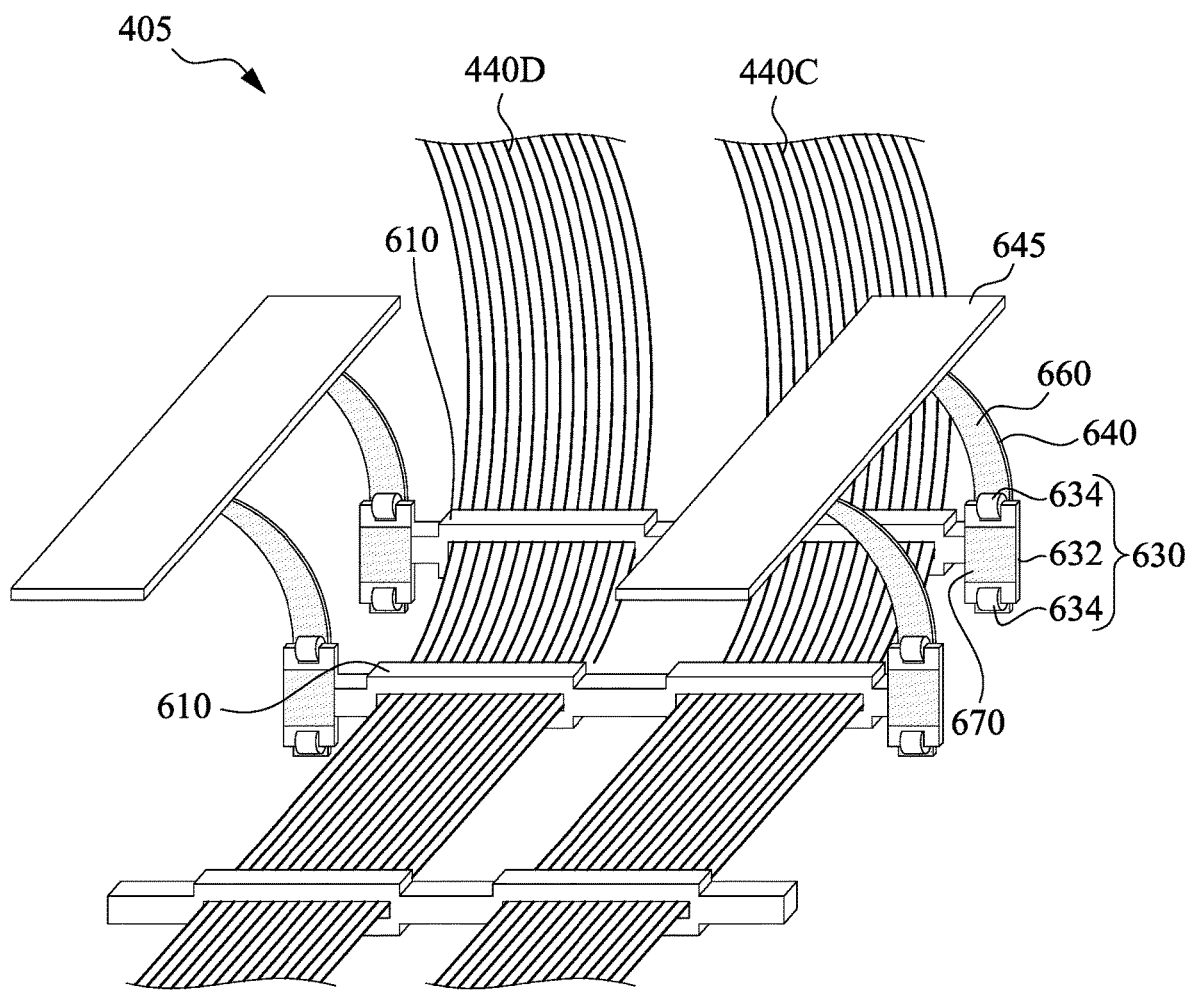
FIG. 8 is a schematic view of a wafer table of a lithography chamber in accordance with some embodiments of the present disclosure.

FIG. 8 is a schematic view of a wafer table of a lithography chamber in accordance with some embodiments of the present disclosure. It is noted that FIG. 8 is a detailed view of the cables 440C and 440D in the wafer table 405 as discussed in FIG. 5, and thus relevant details will not be repeated for simplicity.

In FIG. 8, a plurality of brackets 610 fixes the cables 440C and 440D together. Similar to the first bracket 510 and the second bracket 520 discussed in FIG. 6A, each of the brackets 610 may include wider portions and narrower portions alternately arranged. Different from the first bracket 510 and the second bracket 520 discussed in FIG. 6A, roller structures 630 are disposed on opposite sides of each of the brackets 610. In greater detail, each roller structure 630 includes a body 632 and two wheels 634 disposed on opposite sides of the body 632.

The wafer table 405 further includes rail guides 640, in which two rail guides 640 are disposed on opposite sides of each bracket 610. In some embodiment, each of the roller structures 630 is movable along a surface of a corresponding rail guide 640, in which the rail guides 640 are capable of limiting the motion of the respective roller structures 630 as well as the brackets 610. In some embodiments, the rail guides 640 may include a curved shape. In some embodiments, the rail guides 640 may be made of metal, such as steel, stainless steel, or the like.

The wafer table 405 further includes stopping plates 645 disposed over the rail guides 640. In some embodiments, the stopping plates 645 extends along the first direction (e.g., the X direction) and is coupled to ends of the rail guides 640. In some embodiments, the stopping plates 645 may be a thin metal sheet, and has sufficient flexibility. In some embodiments, the stopping plates 645 may be made of metal such as steel, stainless steel, or the like aluminum. In some other embodiments, the stopping plates 645 may be made of polymer, such as polyetheretherketone (PEEK).

Protective films 660 are disposed on surfaces of the rail guides 640 confronting the corresponding roller structures 630. In some embodiments, surfaces of the rail guides 640 distal to the corresponding roller structures 630 are free from coverage of the protective films 660. In some other embodiments, the surfaces of the rail guides 640 distal to the corresponding roller structures 630 may also be covered by protective films.

Protective films 670 are disposed on surfaces of the body 632 of the roller structures 630 distal to the corresponding rail guides 640. In some embodiments, each protective film 670 covers a middle portion of the body 632 of the corresponding roller structure 630, while opposite sides of the body 632 that are connected to the wheels 634 are not covered by the protective film 670. In some embodiments, an entirety of surfaces of the body 632 of the roller structures 630 confronting the corresponding rail guides 640 are free from coverage of the protective films 670.

In some embodiments, the protective films 660 and 670 may be adhesive films, which is detachable from the surfaces of the rail guides 640 and the roller structures 630, respectively, and may be made of a material that is different from the materials of the rail guides 640 and the roller structures 630. In some embodiments, the protective films 660 and 670 may include a material having friction coefficient less than 0.3, and having a tensile strength (at break point) greater than 48 Mpa in vacuum. In some embodiments, the protective films 660 and 670 may be ultra high molecular weight polyethylene (UHMWPE) tape. In some other embodiments, the protective films 660 and 670 may be silicon pressure sensitive adhesive (PSA). In some embodiments, the protective films 660 and 670 may satisfy a request in a Total Organic Carbon (TOC) test of outgassing limit for refractories is zero (or negligible small) detected under temperatures about 40° C. and about 100° C., this ensure that the protective films 660 and 670 would not be decomposed under the selected temperatures, and would not contaminate other structures in the lithography chamber 400.

Figure 9A:
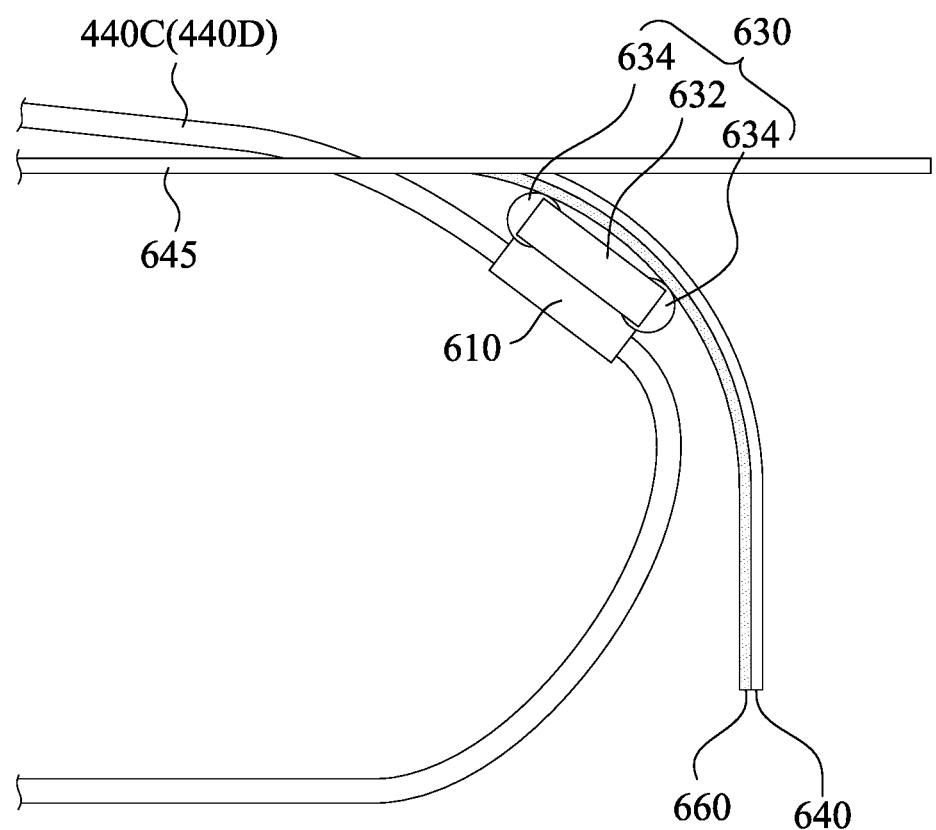
FIGS. 9A and 9B are side views of wafer table of a lithography chamber in accordance with some embodiments of the present disclosure.
Figure 9A:
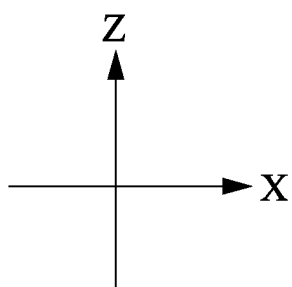
Figure 9B:
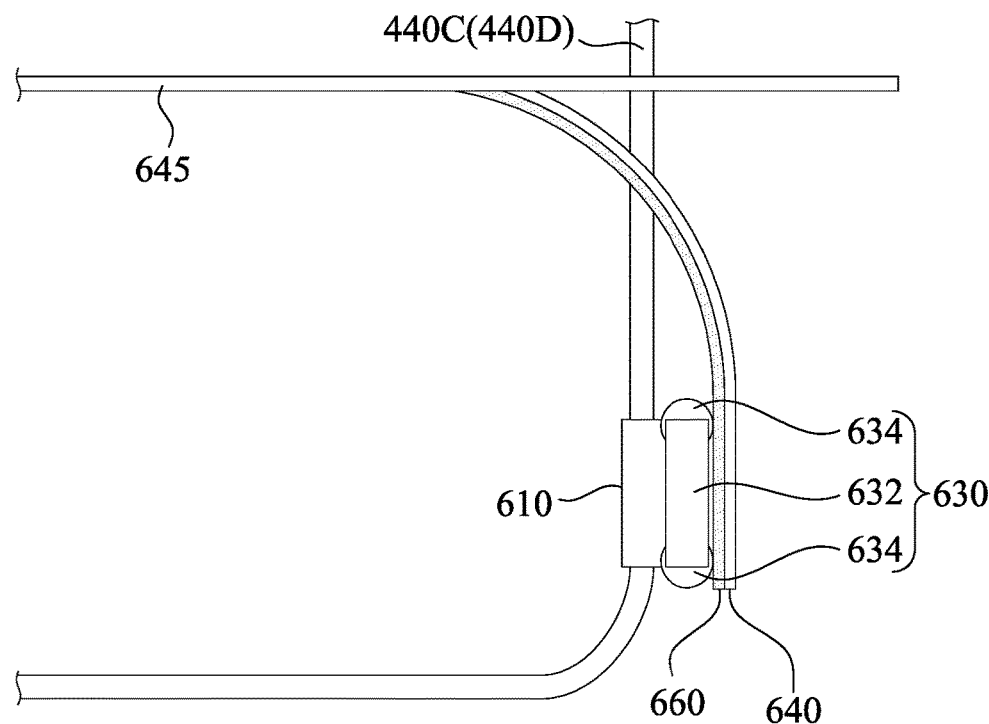
Figure 9B:
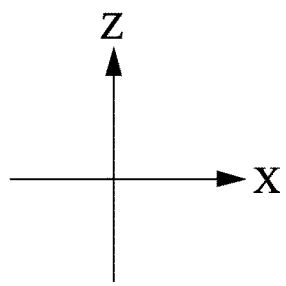

FIGS. 9A and 9B are side views of wafer table of a lithography chamber in accordance with some embodiments of the present disclosure. In greater details, FIGS. 9A and 9B illustrate the structural relationships between the roller structures 630 and the rail guides 640 under different conditions.

Referring to FIGS. 5 and 9A, FIG. 9A illustrates a first condition where the wafer stage 415 is in a first position. For example, to reach the first position, the wafer stage 415 may be moved toward the −X direction by moving the second sliding member 430 toward the −X direction along the slot 412 of the table body 410. Accordingly, the cable 440C (or cable 440D) is pulled upwardly, such that the bracket 610 and the roller structures 630 may be raised together with the cable 440C. Under the first condition, the roller structures 630 are moved upwardly along the surface of the rail guide 640, and may be stopped at the top portion of the rail guide 640.

Referring to FIGS. 5 and 9B, FIG. 9B illustrates a second condition where the wafer stage 415 is in a second position. For example, to reach the second position, the wafer stage 415 may be moved toward the +X direction by moving the second sliding member 430 toward the +X direction along the slot 412 of the table body 410. Accordingly, the cable 440C (or cable 440D) is pushed downwardly, such that the bracket 610 and the roller structures 630 may be raised together with the cable 440C. Under the second condition, the roller structures 630 are moved downwardly along the surface of the rail guide 640, and may be stopped at the top portion of the rail guide 640.

The roller structures 630 may move up and down along the surface of the rail guide 640. Because the protective film 660 is disposed on the surface of the rail guide 640. The roller structures 630 may be in contact with the protective film 660 during the motion. With this configuration, particles generated in the chamber may be reduced by preventing direct rub or collision between roller structure 630 and the rail guide 640. Accordingly, the wafer stage cleaning period can be extended. Further, because the particles are reduced, the wafer fall on particle count (which is determined by a wafer fall on particle monitor) may be reduced.

Figure 10:
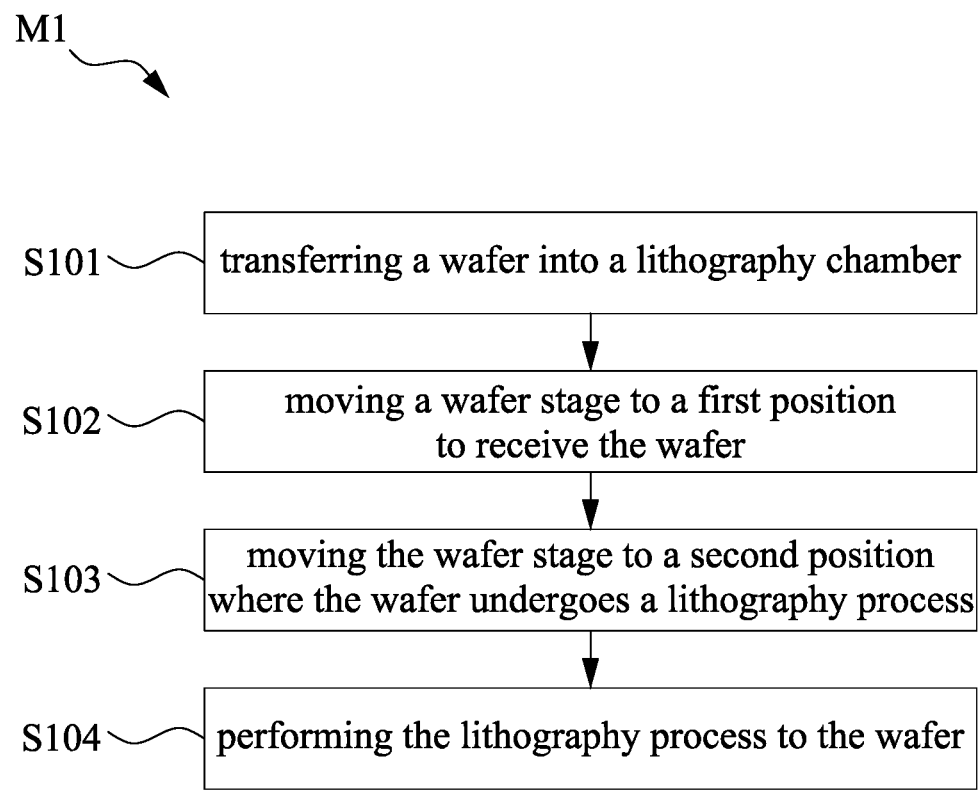
FIG. 10 illustrates a method of forming a semiconductor device in accordance with some embodiments of the present disclosure.

FIG. 10 illustrates a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S101, a wafer is transferred into a lithography chamber. For example, as discussed in FIG. 2, a wafer 250 may be moved from the wafer handler 260, through the load locks 264, 265 and the wafer exchange chamber 266, to the lithography chamber 271. In some embodiments, when the wafer 250 is moved from one space (e.g., a chamber) to another space (e.g., a chamber), the wafer 250 may pass through a corresponding gate valve assembly (e.g., the gate valve assemblies 262, 263, 267, 268, and 270) between the two spaces (e.g., two chambers).

Reference is also made to FIGS. 4A and 4B. Generally, before the wafer 250 passes through the gate valve assembly 262, the gate valve assembly 262 is "CLOSE" where the gate 330 presses against the protective film 340 on the gate valve seat 310 to seal the opening 312 of the gate valve assembly. However, when the wafer 250 is about to pass through the gate valve assembly 262, the gate valve assembly 262 may be "OPEN" to allow the wafer 250 to pass through. As shown in FIG. 4A, the gate 330 is moved downwardly away from the protective film 340 on the gate valve seat 310 to reveal the opening 312 of the gate valve seat 310.

At step S102, a wafer stage is moved to a first position to receive the wafer. At step S103, the wafer stage is moved to a second position where the wafer undergoes a lithography process. In some embodiments, after the wafer 250 is received by the wafer stage, the gate valve assembly 262 may be "CLOSE" again, in which the gate 330 is moved upwardly to press against the protective film 340 on the gate valve seat 310 to seal the opening 312 of the gate valve assembly (see FIGS. 4A and 4B).

From steps S102 to S103, the wafer stage may be moved over an upper surface of a table body of a wafer table. As discussed in FIG. 5, the wafer stage 415 can be moved along a first direction (e.g., the X direction) and a second direction (e.g., the Y direction) by moving the second sliding member 430 and the first sliding member 420, respectively.

As discussed in FIGS. 7A and 7B, when the wafer stage 415 is moved back and forth along the second direction (e.g., the Y direction), the protective films 560 and 570 may touch each other and then separate from each other alternately. Details have been discussed in FIGS. 7A and 7B, and thus relevant descriptions will not be repeated for simplicity.

As discussed in FIGS. 9A and 9B, when the wafer stage 415 is moved back and forth along the first direction (e.g., the X direction), the roller structure 630 may move up and down along the protective film 660 on the rail guide 640. Details have been discussed in FIGS. 9A and 9B, and thus relevant descriptions will not be repeated for simplicity.

At step S104, the lithography process is performed to the wafer. FIG. 1 illustrates an example of the lithography process corresponding to act in step S101.

Figure 11:
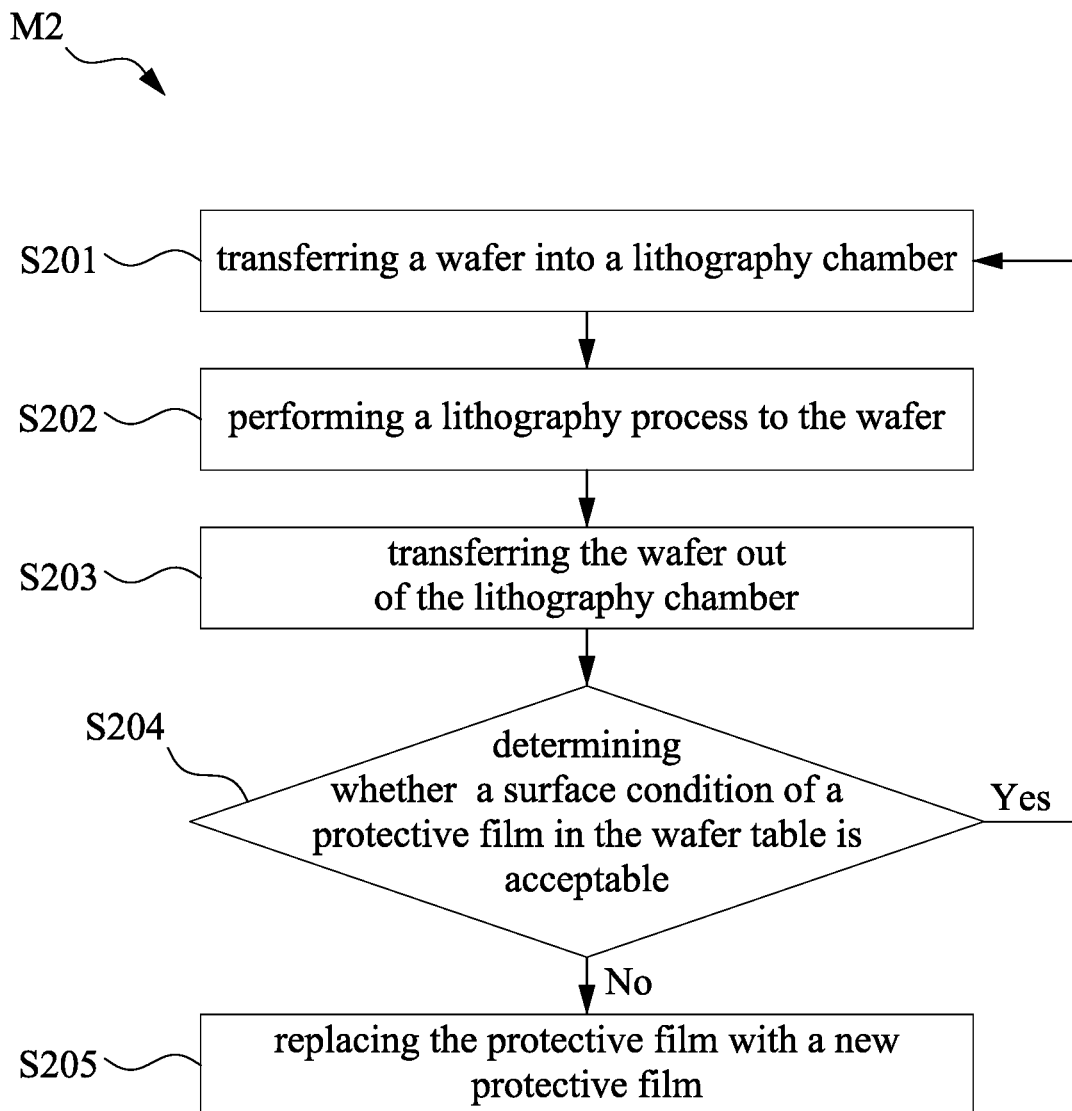
FIG. 11 illustrates a method of forming a semiconductor device in accordance with some embodiments of the present disclosure.

FIG. 11 illustrates a method M2 of forming a semiconductor device in accordance with some embodiments of the present disclosure. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S201, a wafer is transferred into a lithography chamber. At step S202, a lithography process is performed to the wafer. At step S203, the wafer is transferred out of the lithography chamber.

At step S204, whether a surface condition of a protective film in the wafer table is acceptable is determined. In some embodiments, the protective film can be the protective film 340 discussed in FIGS. 3 to 4B, can be the protective films 560 and 570 discussed in FIGS. 6A to 7B, and can also be the protective films 660 and 670 discussed in FIGS. 8 to 9B. It is noted that the protective films 340, 560, 570, 660, and 670 of the embodiments may be made of the same material.

In some embodiments, the user can determine whether a contamination on the surface of the protective film exceeds a threshold value. In some embodiments, the threshold value can include a number of particles falling on the surface of the protective film. In some other embodiments, the threshold value can include a ratio of the contamination area on the surface of the protective films to the whole area of the surface of the protective film. In some other embodiments, the threshold value can include a number of scratches on the surface of the protective film.

If the surface condition of at least one of the protective films in the wafer table does not exceed the threshold value (e.g., the condition is acceptable), the method M2 then returns back to steps S201 and continues proceeding operations Steps S202 through S203.

However, if the surface condition of the protective film in the wafer table exceeds the threshold value (e.g., the condition is unacceptable), the method M2 proceeds to step S205 where the protective film is replaced with a new protective film. In some embodiments, replacing the protective film with the new protective film can be done manually.

If the protective film is the protective film 340 discussed in FIGS. 4A and 4B, the protective film 340 may be peeled off from the surface of the gate valve seat 310, and then a new protective film 340 may be attached to the surface of the gate valve seat 310. If the protective film is the protective film 560 discussed in FIGS. 6A to 7B, the protective film 560 may be peeled off from the surface of the leaf spring 530, and then a new protective film 560 may be attached to the surface of the leaf spring 530. If the protective film is the protective film 570 discussed in FIGS. 6A to 7B, the protective film 570 may be peeled off from the surface of the stopper 550, and then a new protective film 570 may be attached to the surface of the stopper 550. If the protective film is the protective film 660 discussed in FIGS. 8 to 9B, the protective film 660 may be peeled off from the surface of the rail guide 640, and then a new protective film 660 may be attached to the surface of the rail guide 640. If the protective film is the protective film 670 discussed in FIGS. 8 to 9B, the protective film 670 may be peeled off from the surface of the roller structure 630, and then a new protective film 670 may be attached to the surface of the roller structure 630.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that protective films are used to cover surfaces of several structures in a lithography chamber, and the surface of the structures can be protected during performing a lithography process. With this configuration, particles generated in the chamber may be reduced by preventing direct rub or collision between structure and structure. Accordingly, the wafer stage cleaning period can be extended by improving 50% wafer path cleaning (PM) available time (AVL). On the other hand, because the particles are reduced, the wafer fall on particle count (which is determined by a wafer fall on particle monitor) may be reduced to about 0.6 ea to about 0.7 ea. Another advantage is that, the protective film may be cheap and replaceable, it is easy to be applied in a wide area in the lithography chamber, and can lower the cost of the cleaning process. Yet another advantage is that, the particle generated rate on the protective film is low, which will also extend the cleaning period of the lithography chamber.

According to some embodiments of the disclosure, a method includes transferring a wafer over a wafer stage on a wafer table. The wafer table includes a table body, a wafer stage, a first sliding member, a second sliding member, a first cable, a first bracket and a second bracket, and a stopper. The wafer stage is moveably disposed over the table body. The first sliding member is coupled to the wafer stage. The second sliding member is coupled to an edge of the table body, the second sliding member being movable along a first direction, in which the first sliding member is coupled to a track of the second sliding member, the first sliding member being movable along a second direction vertical to the first direction. The first cable is coupled to the wafer stage and extending along the second direction. The first bracket and the second bracket fix the first cable, the first and second bracket are connected by a leaf spring. The stopper is disposed below the first cable. The method includes moving the wafer stage toward the edge of the table body, such that the wafer stage pushes the first cable outwardly, such that the leaf spring is moved toward a first protective film on a surface of the stopper facing the leaf spring. In some embodiments, moving the wafer stage toward the edge of the table body is performed such that the first protective film is in direct contact with a second protective film on a surface of the leaf spring facing the stopper. In some embodiments, moving the wafer stage toward the edge of the table body is performed such that the second bracket is moved downwardly into a slot of the stopper, and the slot of the stopper is free from coverage of the first protective film. In some embodiments, moving the wafer stage toward the edge of the table body is performed such that the second bracket is moved downwardly into a slot of the stopper, and a surface of the slot of the stopper is covered by the first protective film. In some embodiments, the wafer table further includes a second cable, a third bracket, and a rail guide. The second cable is coupled to the second sliding member and extending along the first direction. The third bracket fixes the second cable, the third bracket being coupled to a roller structure, in which the roller structure comprises a body and a wheel coupled to the body. The roller structure is moveable along a surface of the rail guide. The method includes moving the wafer stage along the first direction, such that the roller structure is moved along a second protective film on a surface of the rail guide. In some embodiments, a third protective film is disposed on the body of the roller structure.

In some embodiments, the method further includes determining whether a surface condition of the first protective film is acceptable; and replacing the first protective film with a new first protective film in response to the determination determines that the surface condition is unacceptable. In some embodiments, a surface of the leaf spring facing the stopper is free from coverage of a protective layer. In some embodiments, the first protective film is made of ultra high molecular weight polyethylene (UHMWPE) tape and silicon pressure sensitive adhesive (PSA).

According to some embodiments of the disclosure, a method includes transferring a wafer into a first chamber of a load lock, the first chamber being coupled to a gate valve assembly having a gate valve seal and a gate pressing against a protective film on a surface of the gate valve seal; moving the gate downwardly away from the protective film on the surface of the gate valve seal to reveal an opening of the gate valve seal; transferring the wafer from the first chamber, through the opening of the gate valve seal, to a second chamber; and performing a semiconductor process to the wafer in the second chamber. In some embodiments, the method further includes after performing the semiconductor process to the wafer, determining whether a surface condition of the protective film is acceptable; and replacing the protective film with a new protective film in response to the determination determines that the surface condition is unacceptable. In some embodiments, replacing the protective film with the new protective film includes peeling off the protective film from the surface of the gate valve seal; and attaching the new protective film on the surface of the gate valve seal. In some embodiments, the method further includes after transferring the wafer from the first chamber to the second chamber and prior to performing the semiconductor process, moving the gate upwardly to press a sealing material of the gate against the protective film on the surface of the gate valve seal again. In some embodiments, an entirety of the surface of the gate valve seal is separated from the sealing material of the gate by the protective film when the sealing material of the gate is pressed against the protective film. In some embodiments, the protective film is made of ultra high molecular weight polyethylene (UHMWPE) tape and silicon pressure sensitive adhesive (PSA).

According to some embodiments of the disclosure, a lithography system includes a table body, a wafer stage, a first sliding member, a second sliding member, a first cable, a first bracket, a rail guide, and a first protective film. The wafer stage is moveably disposed over the table body. The first sliding member is coupled to the wafer stage. The second sliding member is coupled to an edge of the table body, the second sliding member being movable along a first direction, in which the first sliding member is coupled to a track of the second sliding member, the first sliding member being movable along a second direction vertical to the first direction. The first cable is coupled to the second sliding member and extending along the first direction. The first bracket fixes the first cable, the first bracket being coupled to a roller structure, in which the roller structure includes a body and a wheel coupled to the body. The rail guide confines a movement of the wheel of the roller structure. The first protective film is adhered to a surface of the rail guide, in which the roller structure is moveable along the first protective film on the surface of the rail guide. In some embodiments, the body of the roller structure has a surface distal to the surface of the rail guide, and the surface of the body of the roller structure is covered by a second protective film. In some embodiments, the lithography system further includes a second cable, a second bracket and a third bracket, and a stopper. The second cable is coupled to the wafer stage and extending along the second direction. The second bracket and the third bracket fix the first cable, the second and third brackets are connected by a leaf spring. The stopper is disposed below the first cable, in which the stopper has a surface facing the leaf spring, and the surface of the stopper is covered by a second protective film. In some embodiments, the second protective film has a first portion, a second portion, and a third portion, the first portion being connected to the second portion, and the third portion is separated from the second portion by a slot of the stopper, in which the first portion is narrower than the second portion and the third portion. In some embodiments, the lithography system further includes a gate valve assembly having a gate valve seal, a gate, and a second protective layer. The gate is detachably coupled to the gate valve seal, in which the gate includes a sealing material presses against a surface of the gate valve seal. The second protective layer covers the surface of the gate valve seal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    transferring a wafer over a wafer stage on a wafer table, the wafer table comprising:
        a table body, the wafer stage being moveably disposed over the table body;
        a first sliding member coupled to the wafer stage;
        a second sliding member coupled to an edge of the table body, the second sliding member being movable along a first direction, wherein the first sliding member is coupled to a track of the second sliding member, the first sliding member being movable along a second direction vertical to the first direction;
        a first cable coupled to the wafer stage and extending along the second direction;
        a first bracket and a second bracket fixing the first cable, the first and second bracket are connected by a leaf spring; and
        a stopper disposed below the first cable; and
    moving the wafer stage toward the edge of the table body, such that the wafer stage pushes the first cable outwardly, such that the leaf spring is moved toward a first protective film on a surface of the stopper facing the leaf spring.

2. The method of claim 1, wherein moving the wafer stage toward the edge of the table body is performed such that the first protective film is in direct contact with a second protective film on a surface of the leaf spring facing the stopper.

3. The method of claim 1, wherein moving the wafer stage toward the edge of the table body is performed such that the second bracket is moved downwardly into a slot of the stopper, and the slot of the stopper is free from coverage of the first protective film.

4. The method of claim 1, wherein moving the wafer stage toward the edge of the table body is performed such that the second bracket is moved downwardly into a slot of the stopper, and a surface of the slot of the stopper is covered by the first protective film.

5. The method of claim 1, wherein:
the wafer table further comprises:
a second cable coupled to the second sliding member and extending along the first direction;
a third bracket fixing the second cable, the third bracket being coupled to a roller structure, wherein the roller structure comprises a body and a wheel coupled to the body; and
a rail guide, wherein the roller structure is moveable along a surface of the rail guide; and
the method further comprises moving the wafer stage along the first direction, such that the roller structure is moved along a second protective film on a surface of the rail guide.

6. The method of claim 5, wherein a third protective film is disposed on the body of the roller structure.

7. The method of claim 1, further comprising:
determining whether a surface condition of the first protective film is acceptable; and
replacing the first protective film with a new first protective film in response to the determination determines that the surface condition is unacceptable.

8. The method of claim 1, wherein a surface of the leaf spring facing the stopper is free from coverage of a protective layer.

9. The method of claim 1, wherein the first protective film is made of ultra high molecular weight polyethylene (UHMWPE) tape or silicon pressure sensitive adhesive (PSA).

10. A method, comprising:
transferring a wafer over a wafer stage on a wafer table, the wafer table comprising:
a table body, the wafer stage being moveably disposed over the table body;
a first sliding member coupled to the wafer stage;
a second sliding member coupled to an edge of the table body, the second sliding member being movable along a first direction, wherein the first sliding member is coupled to a track of the second sliding member, the first sliding member being movable along a second direction vertical to the first direction;
a first cable coupled to the second sliding member and extending along the first direction;
a first bracket fixing the first cable, the first bracket being coupled to a roller structure, wherein the roller structure comprises a body and a wheel coupled to the body; and
a rail guide, wherein the roller structure is moveable along a surface of the rail guide; and
moving the wafer stage along the first direction, such that the roller structure is moved along a first protective film on a surface of the rail guide.

11. The method of claim 10, wherein a second protective film is disposed on a surface of the body of the roller structure distal to the rail guide.

12. The method of claim 10, further comprising:
determining whether a surface condition of the first protective film is acceptable; and
replacing the first protective film with a new first protective film in response to the determination determines that the surface condition is unacceptable.

13. The method of claim 10, wherein the first protective film is made of ultra high molecular weight polyethylene (UHMWPE) tape or silicon pressure sensitive adhesive (PSA).

14. The method of claim 10, wherein the wafer table further comprises:
a second cable coupled to the wafer stage and extending along the second direction;
a second bracket and a third bracket fixing the second cable, the second and third bracket are connected by a leaf spring; and
a stopper disposed below the second cable, wherein a second protective film is disposed on a surface of the stopper facing the leaf spring.

15. The method of claim 14, wherein a third protective film is disposed on a surface of the leaf spring facing the stopper.

16. The method of claim 15, further comprising moving the wafer stage toward the edge of the table body, such that the wafer stage pushes the first cable outwardly, such that the third protective film on the leaf spring is in contact with the second protective film on the stopper.

17. A method, comprising:
transferring a wafer over a wafer stage on a wafer table, the wafer table comprising:
a table body, the wafer stage being moveably disposed over the table body;
a first sliding member coupled to the wafer stage;
a second sliding member coupled to an edge of the table body, the second sliding member being movable along a first direction, wherein the first sliding member is coupled to a track of the second sliding member, the first sliding member being movable along a second direction vertical to the first direction;
a first cable coupled to the wafer stage and extending along the second direction;
a first bracket and a second bracket fixing the first cable, the first and second bracket are connected by a leaf spring; and
a stopper disposed below the first cable; and
moving the wafer stage toward the edge of the table body, such that the wafer stage pushes the first cable outwardly, such that a first protective film on a surface of the leaf spring is moved toward the stopper.

18. The method of claim 17, wherein moving the wafer stage toward the edge of the table body is performed such that the first protective film on the surface of the leaf spring is in contact with a second protective film on a surface of the stopper.

19. The method of claim 17, wherein the wafer is transferred over the wafer stage on the wafer table through a gate valve assembly having a gate valve seal and a gate pressing against a second protective film on a surface of the gate valve seal, wherein transferring the wafer over the wafer stage on the wafer table comprises:
moving the gate downwardly away from the second protective film on the surface of the gate valve seal to reveal an opening of the gate valve seal; and
placing the wafer, using a robot arm, on the wafer stage.

20. The method of claim 19, further comprising:
after transferring the wafer over the wafer stage on the wafer table, moving the gate upwardly to press a sealing material of the gate against the second protective film on the surface of the gate valve seal.

* * * * *